United States Patent
Bai et al.

(10) Patent No.: US 9,443,746 B2
(45) Date of Patent: Sep. 13, 2016

(54) FLOATING MOLD TOOL FOR SEMICONDCUTOR PACKAGING

(71) Applicants: Zhigang Bai, Tianjin (CN); Xingshou Pang, Tianjin (CN); Jinzhong Yao, Tianjin (CN)

(72) Inventors: Zhigang Bai, Tianjin (CN); Xingshou Pang, Tianjin (CN); Jinzhong Yao, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 33 days.

(21) Appl. No.: 14/562,770

(22) Filed: Dec. 7, 2014

(65) Prior Publication Data

US 2016/0049318 A1    Feb. 18, 2016

(30) Foreign Application Priority Data

Aug. 15, 2014    (CN) .......................... 2014 1 0520113

(51) Int. Cl.

| | |
|---|---|
| *H01L 23/495* | (2006.01) |
| *H01L 21/67* | (2006.01) |
| *H01L 21/56* | (2006.01) |
| *H01L 21/48* | (2006.01) |
| *H01L 23/31* | (2006.01) |
| *H01L 23/00* | (2006.01) |

(52) U.S. Cl.
CPC ..... *H01L 21/67126* (2013.01); *H01L 21/4842* (2013.01); *H01L 21/565* (2013.01); *H01L 23/49551* (2013.01); *H01L 23/3107* (2013.01); *H01L 24/32* (2013.01); *H01L 24/48* (2013.01); *H01L 24/49* (2013.01); *H01L 24/73* (2013.01); *H01L 2224/32245* (2013.01); *H01L 2224/48091* (2013.01); *H01L 2224/48247* (2013.01); *H01L 2224/49109* (2013.01); *H01L 2224/73265* (2013.01)

(58) Field of Classification Search
CPC .......... H01L 2224/32245; H01L 2224/73265; H01L 2224/48247; H01L 2224/49109; H01L 2924/00; H01L 2924/00012; H01L 21/4842; H01L 21/565; H01L 21/67126; H01L 2224/48091; H01L 23/3107; H01L 23/49551; H01L 24/32; H01L 24/48
USPC ....................................................... 257/676
See application file for complete search history.

(56) References Cited

U.S. PATENT DOCUMENTS

| | | |
|---|---|---|
| 5,122,021 A * | 6/1992 | Medal ................. B29C 45/0005 411/369 |
| 5,420,459 A | 5/1995 | Kozono |
| 5,557,143 A | 9/1996 | Seiji |
| 5,640,746 A | 6/1997 | Knecht et al. |
| 5,914,529 A | 6/1999 | King |

(Continued)

FOREIGN PATENT DOCUMENTS

JP    04-180668    6/1992

*Primary Examiner* — Phat X Cao
*Assistant Examiner* — Mohammad M Hoque
(74) *Attorney, Agent, or Firm* — Charles E. Bergere

(57) ABSTRACT

Tooling for molding a packaged semiconductor device includes a clamping plate, a cavity bar, and an attachment mechanism. The cavity bar has a mold half that has a mold cavity for molding the packaged semiconductor device. The mold half has teeth and a space between pairs of adjacent teeth. The teeth and the spaces support bending of leads of a lead frame of the packaged semiconductor device. The attachment mechanism affixes the cavity bar to the clamping plate and permits the cavity bar to slide relative to the clamping plate. This sliding of the cavity bar enables proper alignment with a mating cavity bar to reduce the likelihood of resin bleed.

5 Claims, 4 Drawing Sheets

(56) References Cited

U.S. PATENT DOCUMENTS

| | | |
|---|---|---|
| 6,008,073 A | 12/1999 | King |
| 6,025,640 A | 2/2000 | Yagi |
| 6,078,099 A | 6/2000 | Liu |
| 6,201,294 B1 | 3/2001 | Lee |
| 6,388,311 B1 | 5/2002 | Nakashima |
| 6,627,976 B1 | 9/2003 | Chung et al. |
| 6,851,944 B2 | 2/2005 | Effenberger |
| 6,876,068 B1 | 4/2005 | Lee et al. |
| 7,102,214 B1 | 9/2006 | Miks et al. |
| 7,102,216 B1 | 9/2006 | Foster |
| 7,345,357 B2 | 3/2008 | Tan et al. |
| 7,727,817 B2 | 6/2010 | Xu et al. |
| 7,846,774 B2 | 12/2010 | Yee et al. |
| 8,022,539 B2 | 9/2011 | Dahilig et al. |
| 8,062,424 B2 | 11/2011 | Manikam et al. |
| 8,184,453 B1 | 5/2012 | Kim et al. |
| 8,188,582 B2 | 5/2012 | Seo |
| 8,198,143 B2 | 6/2012 | Eu et al. |
| 8,525,311 B2 | 9/2013 | Bai et al. |
| 8,610,253 B2 | 12/2013 | Yurino |
| 8,859,339 B2 | 10/2014 | Bai et al. |
| 2004/0201080 A1 | 10/2004 | Basoor |
| 2007/0001278 A1 | 1/2007 | Jeon |
| 2007/0278633 A1 | 12/2007 | Uematsu |
| 2008/0290487 A1 | 11/2008 | Zhao |
| 2010/0001386 A1 | 1/2010 | Misumi |
| 2013/0196473 A1 | 8/2013 | Bai |
| 2014/0035199 A1* | 2/2014 | Kotitschke .......... B29C 45/0416 264/328.11 |
| 2016/0049318 A1* | 2/2016 | Bai ................... H01L 21/67126 257/676 |

\* cited by examiner

FLOATING MOLD TOOL FOR SEMICONDCUTOR PACKAGING

BACKGROUND OF THE INVENTION

The present invention relates generally to semiconductor packaging using surface-mount technologies (SMTs), and, more particularly, to mold tooling used in assembling semiconductor packages.

In the field of semiconductor packaging, there has been a demand for smaller packages yet with an increased number of leads. The number of leads has typically been limited by factors such as the size of the package and the pitch of the leads. Decreasing the spacing between leads increases the likelihood that the leads will be shorted together.

In order to overcome these problems, packaged semiconductor devices have been developed that have two sets of metal leads, where the first set of leads begins on a first plane and the second set begins on a second plane, different from the first plane. Such packaged semiconductor devices are capable of having greater numbers of leads than comparable packaged semiconductor devices in which all of the metal leads begin on the same plane.

FIGS. 1A and 1B show cross-sectional and side views, respectively, of a conventional packaged semiconductor device 100 having sets of metal leads that begin on two different planes. The following discussion provides a brief explanation of the device 100 and a method for bending the leads and encapsulating the device 100 in molding compound.

The device 100 has a metal lead frame 102 comprising a die paddle 104 and first and second sets of leads 106 and 112. The die paddle 104 is positioned on a first horizontal plane H1 of the device 100. The leads 106 and 112 are physically and electrically isolated from each other and from the die paddle 104. Each of the leads 106 has (i) a proximal end 108 that is located on the same horizontal plane H1 as the die paddle 104 and (ii) a distal end 110 that extends away from the die paddle 104 to a second horizontal plane H2. Each of the leads 112 in the second set of metal leads has (i) a proximal end 114 that is located on a third horizontal plane H3 that is above the first horizontal plane H1 and (ii) a distal end 116 that extends away from the die paddle 104 to the second horizontal plane H2.

In addition, each lead 112 is bent toward the bottom of the device 100 such that the lead 112 clears the distal end 110 of the adjacent leads 106. In this embodiment, two leads 106 and three leads 112 are shown in FIG. 1B on the front side of the device 100. However, the numbers of the leads 106 and 112 may be greater than that shown, and the spacing between the leads 106 and 112 may be smaller than that shown.

As shown in FIG. 1A, at least one integrated circuit (IC) die 118 is mounted on the die paddle 104. Further, bond wires 120 electrically connect (i) die pads (not explicitly depicted) on the upper surface (i.e., active side) of the IC die 118 and (ii) the proximal ends 108 and 114 of the leads 106 and 112, respectively. The die paddle 104, the IC die 118, the proximal ends 108 and 114 of the leads 106 and 112, respectively, and the bond wires 120 are encapsulated in a molding compound 122, which protects these components from contamination and damage.

FIGS. 2A and 2B show side views that illustrate steps of encapsulating the packaged semiconductor device 100 of FIGS. 1A and 1B in the molding compound 122 using a mold 200.

In FIG. 2A, a partially-assembled packaged semiconductor device comprising the lead frame 102, IC die 118, and bond wires 120 is positioned between upper and lower halves 202 and 212 of a mold 200. Before molding, the lead frame 102 is a planar piece of metal having the die paddle 104 and the leads 106 and 112 formed thereon for example by etching, cutting, and/or stamping. Note that the distal ends 110 and 116 of the metal leads 106 and 112, respectively, are connected to one another by connecting bars 124, which are cut away after the molding process. However, for illustrative purposes, the connecting bar 124 that interconnects the leads 106 and 112 projecting out of the package 100 is not shown in FIG. 2A or 2B.

The upper mold half 202 comprises a plurality of chamfered teeth 204 and a space 208 located on either side of each tooth 204. Further, the upper mold half 202 has an upper mold cavity 210 formed therein. The upper mold cavity 210 is not visible in the side view, and therefore, it is shown via dashed lines to indicate that it is hidden from view.

Similarly, the lower mold half 212 comprises a plurality of chamfered teeth 214, a space 218 located on either side of each tooth 214, and a lower mold cavity 220. The teeth 214 and spaces 218 of the lower mold half 212 alternate with the teeth 204 and spaces 208 of the upper mold half 202 such that (i) the teeth 204 of the upper mold half 202 mate with the spaces 218 of the lower mold half 212 and (ii) the teeth 214 of the lower mold half 212 mate with the spaces 208 of the upper mold half 202. Note that all four sides of the mold 200 may be similar in appearance to the side shown in FIG. 2A.

In FIG. 2B, the mold 200 is in a closed position with the partially-assembled packaged semiconductor device positioned therein. As shown, when the upper and lower mold halves 202 and 212 are brought together, the leads 106 are bent into the spaces 218 of the lower mold half 212 in alignment with horizontal plane H1 by the teeth 204 of the upper mold half 202, and the leads 112 are bent into the spaces 208 of the upper mold half 202 in alignment with horizontal plane H3 by the teeth 214 of the lower mold half 212. Chamfers 206a and 206b (FIG. 2A) are formed on the teeth 204, and chamfers 216a and 216b (FIG. 2A) are formed on the teeth 214 to help guide the teeth 204 and 214 into the corresponding spaces 218 and 208, respectively, on the opposing mold half.

After the mold 200 is closed, the molding compound (not shown) is injected into the cavities 210 and 220 of the mold 200. When the molding compound cures, the metal leads 106 and 112 are held in place on the two horizontal planes H1 and H3 by the cured molding compound. It would be advantageous to be able to form a package having leads that lie in spaced parallel planes but with reduced resin bleeding and where the dimensions of the leads and the lead pitch is reduced.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2A:
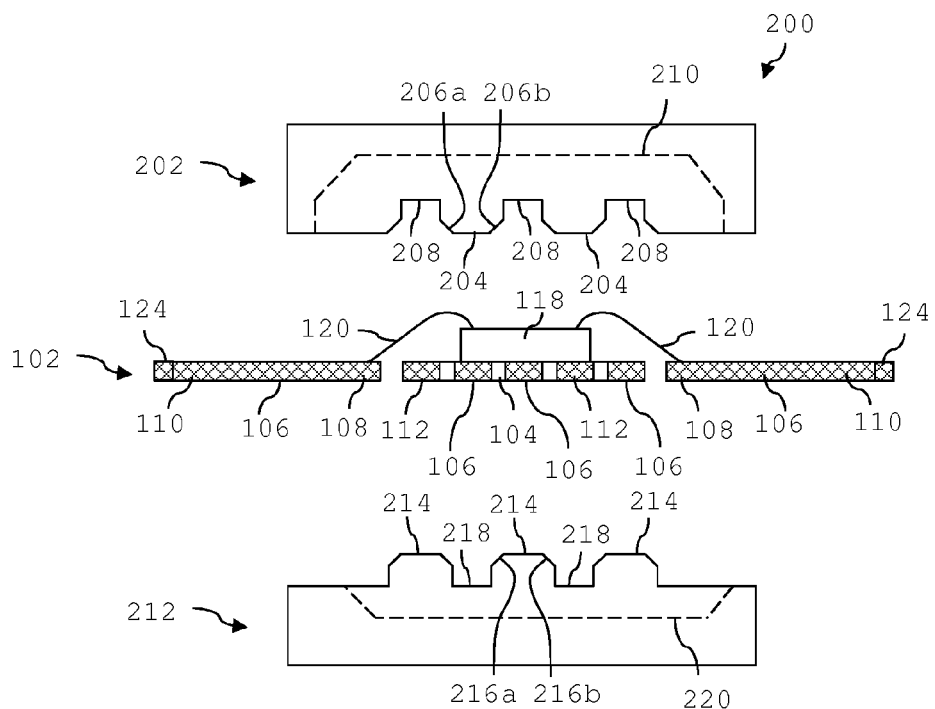
FIGS. 2A and 2B show side views that illustrate the steps of encapsulating the packaged semiconductor device of FIGS. 1A and 1B in molding compound and bending the leads using a mold.
Figure 2B:
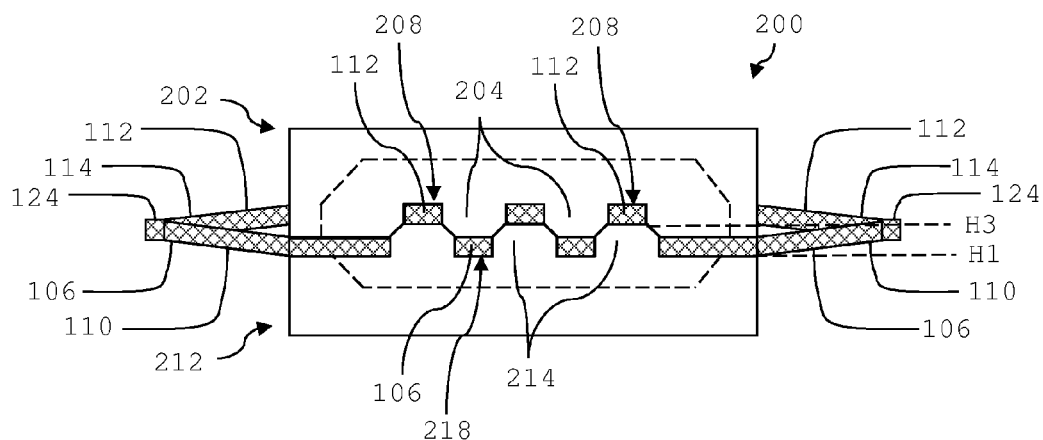

Conventional tooling (not shown) used to open and close the mold 200 in FIGS. 2A and 2B moves the upper and lower mold halves 202 and 212 only in the vertical direction. Ideally, when the mold 200 is closed, the upper and lower mold halves 202 and 212 seat properly against one another such that each chamfer 206a and 206b of the upper mold half 202 fits tightly against the corresponding chamfer 216a and 216b of the lower mold half 212. However, in practice, the upper and lower mold halves 202 and 212 might not seat properly against one another.

Figure 3:
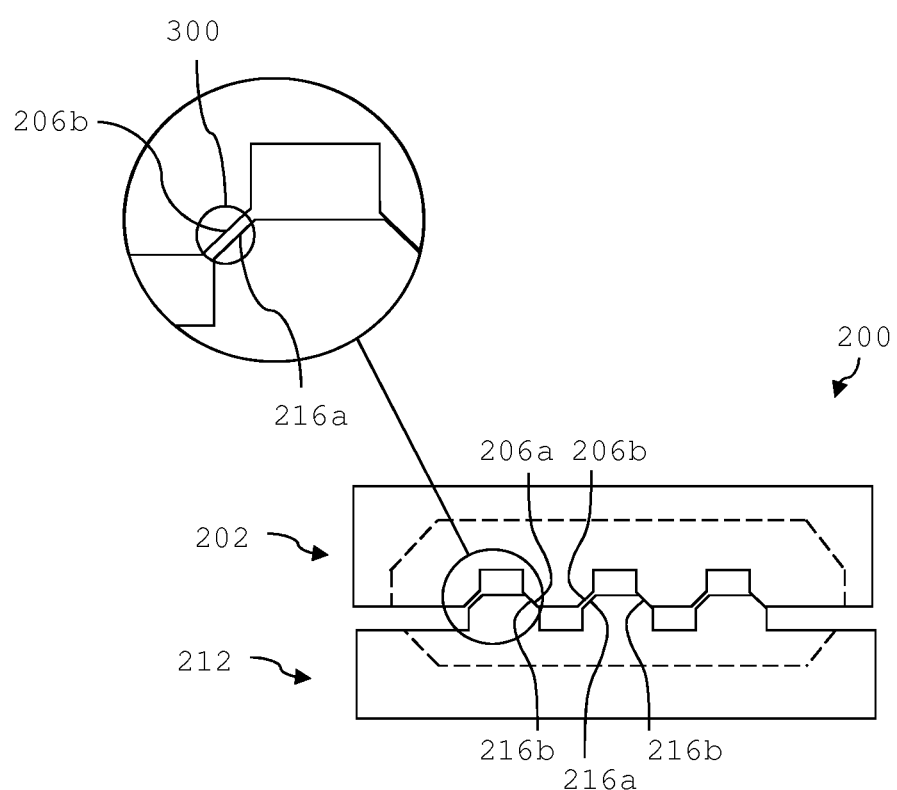
FIG. 3 shows a side view of the mold of FIGS. 2A and 2B in a closed position in which the upper and lower mold halves are not seated properly against one another.

FIG. 3 shows a side view of the mold 200 of FIG. 2 in a closed position in which the upper and lower mold halves 202 and 212 are not seated properly against one another due to horizontal misalignment of the two mold halves. As shown, although each chamfer 216b on the lower mold half 212 abuts a corresponding chamfer 206a of the upper mold half 202, each chamfer 216a on the lower mold half 212 does not abut a corresponding chamfer 206b on the upper mold half 202. As a result, a gap 300 exists between each chamfer 216a and each corresponding chamfer 206b as shown in the detail view. These gaps 300 can lead to resin bleed, wherein molding compound injected into the mold 200 leaks outside of the mold 200 through the gaps 300.

In the following description, it will be understood that certain embodiments of the present invention are related to mold tooling for packaged semiconductor sensor devices that enable movement of mold halves horizontally, as well as vertically. This horizontal movement enables the mold halves to be seated properly to reduce the likelihood of resin bleed.

Accordingly, in one embodiment, the present invention is tooling for molding a packaged semiconductor device. The tooling comprises a clamping plate, a cavity bar comprising a mold half, and an attachment mechanism. The mold half has a mold cavity formed therein for molding the packaged semiconductor device and comprises (i) a plurality of teeth and (ii) a space between each pair of adjacent teeth. The teeth and the spaces support bending of leads of a lead frame of the packaged semiconductor device. The attachment mechanism affixes the cavity bar to the clamping plate, wherein the attachment mechanism permits the cavity bar to slide relative to the clamping plate.

In another embodiment, the present invention is a method for manufacturing a packaged semiconductor device using the tooling described above. In performance of the method, a partially-assembled packaged semiconductor device is positioned between the mold half and a corresponding mold half. The partially-assembled packaged semiconductor device comprises a lead frame comprising a plurality of leads. The mold half and the corresponding mold half are brought together in a first direction. As a result, the cavity bar slides in a second direction perpendicular to the first direction of the tooling to align the teeth and spaces with corresponding structures on the corresponding mold half, and the teeth and spaces bend the leads of the lead frame into a bent position. Molding compound is injected into the mold half and the corresponding mold half, and the molding compound maintains the leads in the bent position.

Figure 4:
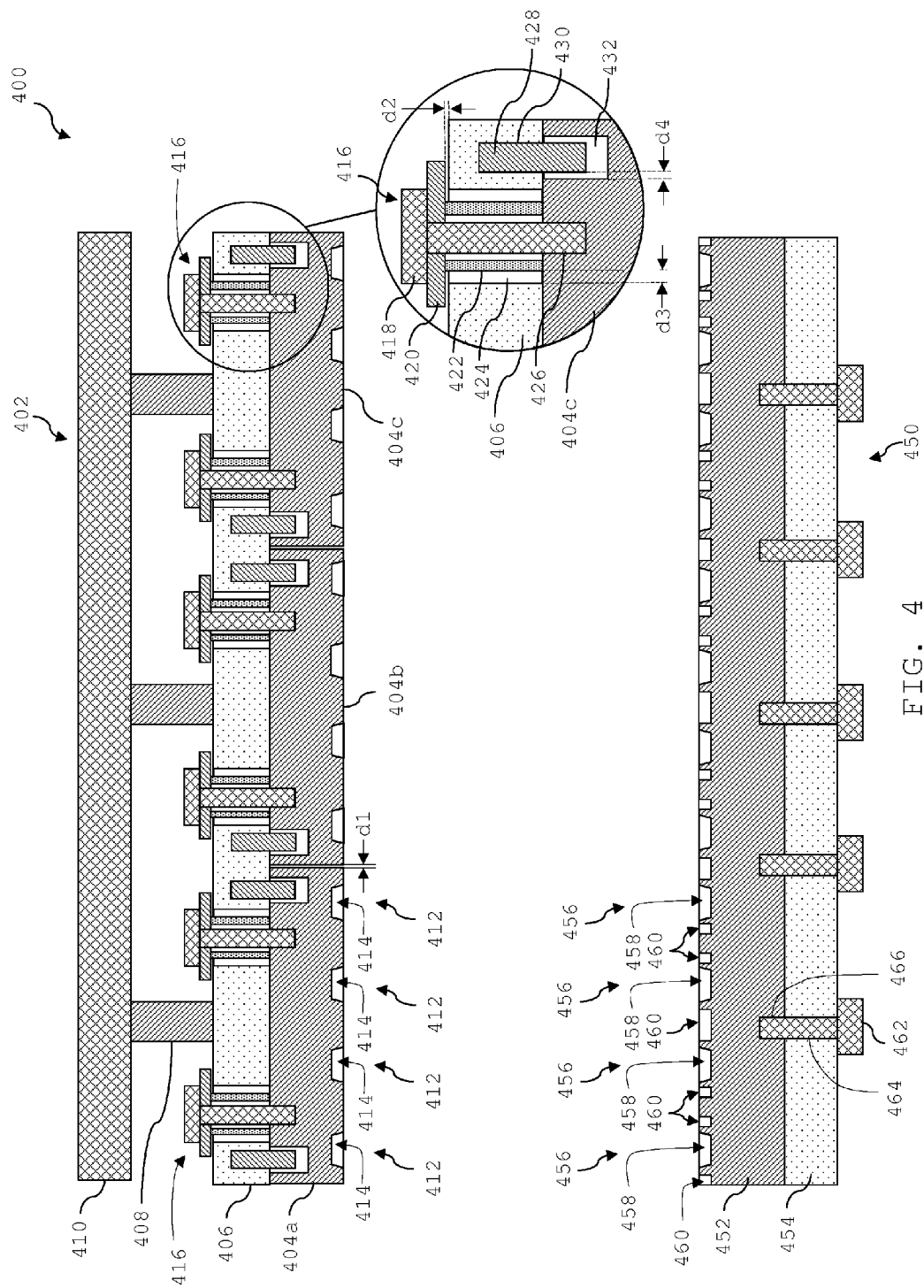
FIG. 4 shows a cross-sectional side view of mold tooling according to one embodiment of the present invention for molding packaged semiconductor devices.

Referring now to FIG. 4, a cross-sectional side view of mold tooling 400 according to one embodiment of the present invention is shown. The mold tooling 400 comprises an upper mold-tooling portion 402 that moves vertically in response to a mechanical press (not shown) and a lower, stationary, mold-tooling portion 450.

The upper mold-tooling portion 402 comprises (i) three upper cavity bars 404a-404c, which are spaced by a distance d1, (ii) an upper clamping plate 406, (iii) pillars 408, and (iv) a push bar 410. Each upper cavity bar 404a-404c comprises a one- or two-dimensional array of interconnected upper mold halves 412, where each upper mold half 412 may be similar to the upper mold half 202 in FIGS. 2A and 2B. Note that, in this view, one row of the upper mold halves 412 is shown, and there may be further rows of the upper mold halves 412 fore and/or aft of the row shown.

Each upper mold half 412 has (i) an upper mold cavity 414 formed therein similar to the upper mold cavity 210 of FIGS. 2A and 2B, (ii) a plurality of chamfered teeth similar to teeth 204, and (iii) and a plurality of spaces similar to spaces 208. Note, however, that the teeth and spaces are not shown in FIG. 4 due to the fact that FIG. 4 shows a cross-sectional, not side, view. Further, the numbers of teeth and spaces, the sizes of the teeth and spaces, the distance between teeth, and the size and configuration of the mold cavity may vary from what is shown in FIGS. 2A and 2B.

Each cavity bar 404a-404c is attached to the upper clamping plate 406 using a plurality of attachment mechanisms 416 that permit the cavity bars 404a-404c to slide horizontally side-to-side and fore and aft (i.e., in directions that are perpendicular to the clamping motion of the mold tooling 400). As shown in the detail view, each attachment mechanism 416 comprises a threaded fastener 418, an annular washer 420, and an annular spacer 422. In each attachment mechanism, the threaded fastener 418 is fed through (i) the annular washer 420, which is positioned between the head of the threaded fastener 418 and the upper surface of the upper clamping plate 406, and (ii) the annular spacer 422, which is positioned in a cylindrical cavity 424 formed in the upper clamping plate 406. Further, the threaded fastener 418 is secured to the corresponding upper cavity bar 404a-404c by screwing the threaded fastener 418 into a tapped recess 426 in the corresponding upper cavity bar 404a-404c.

The spacer 422 spaces the lower surface of the washer 420 from the upper surface of the upper clamping plate 406 by a distance d2, which, in at least some embodiments, is between approximately 0 mm and 0.005 mm. The spacer 422 has an outer radius that is smaller than the radius of the cylindrical cavity 424 by a distance d3, which, in at least some embodiments, is between approximately 0.005 mm and 0.01 mm. This configuration enables the threaded fastener 418, washer 420, and the spacer 422 to translate horizontally within the cylindrical cavity 424. As a result, the upper cavity bars 404a-404c, which are secured to the threaded fasteners 418, are permitted to slide horizontally independently of the upper clamping plate 406.

To limit the distance over which the upper cavity bars 404a-404c can move, a plurality of cylindrical location pins 428 are provided. As shown in the detail view, each cylindrical location pin 428 is press fit into a cylindrical recess 430 formed in the upper clamping plate 406 and extends into a cylindrical recess 432 formed in the corresponding upper cavity bar 404a-404c. Further, each cylindrical location pin 428 has a radius that is smaller than the radius of the cylindrical recess 432 by a distance d4. The distance d4 is less than distance d3, and therefore, the location pins 428 prevent the threaded fastener 418, annular washer 420, and annular spacer 422 of each attachment mechanism from traveling the full distance d3. As a result, the distance over which the upper cavity bars 404a-404c may slide horizontally is also limited by the cylindrical location pins 428.

The lower mold-tooling portion 450 comprises a lower cavity bar 452 and a lower clamping plate 454. The lower cavity bar 452 comprises a one- or two-dimensional array of interconnected lower mold halves 456, where each lower mold half 456 may be similar to the lower mold half 212 in FIGS. 2A and 2B. Note that, in this view, one row of lower mold halves 456 is shown, and there may be one or more additional rows of the lower mold halves 456 to mate with one or more additional rows in upper mold halves 412.

Each lower mold half 456 has (i) a lower mold cavity 458 formed therein similar to the lower mold cavity 220 of FIGS. 2A and 2B, (ii) a plurality of chamfered teeth (not shown in this view) similar to teeth 214, and (iii) and a plurality of spaces (also not shown in this view) similar to spaces 218. Note that the numbers of teeth and spaces, the sizes of the teeth and spaces, the distance between teeth, and the size and configuration of the mold cavity may vary from what is shown in FIGS. 2A and 2B.

Figure 1A:
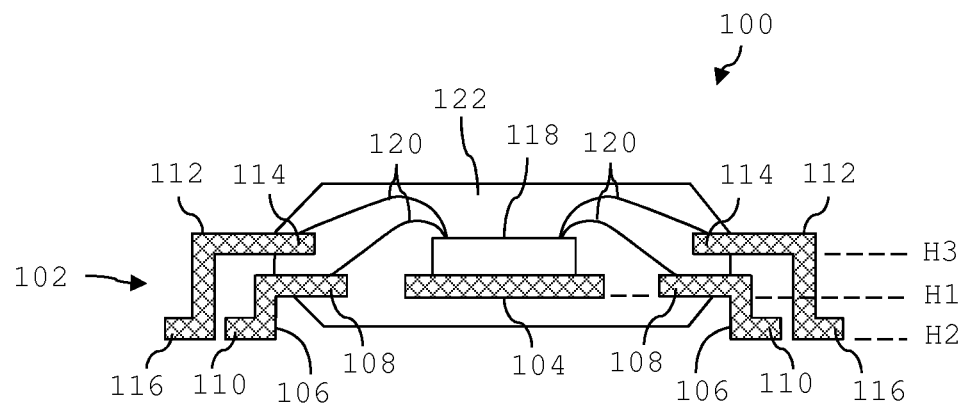
FIGS. 1A and 1B show cross-sectional and side views, respectively, of a prior-art packaged semiconductor device having metal leads that begin on two different planes.
Figure 1B:
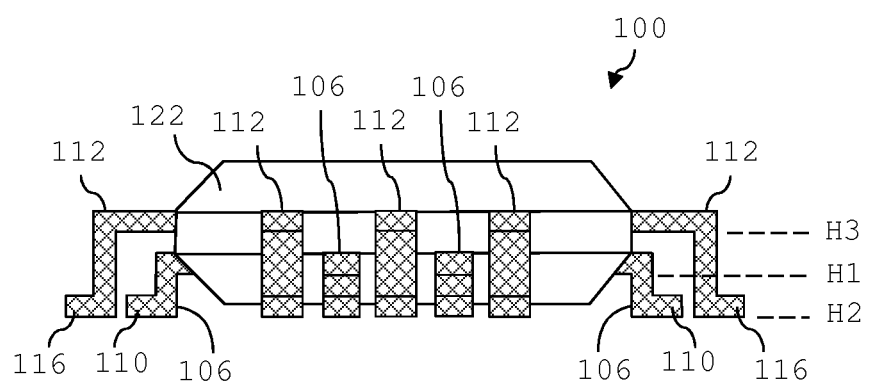

A recess 460 is formed on each side of the lower mold cavity 458. The recesses 460 receive the distal ends (e.g., 110 and 116 of FIG. 1) of the metal leads while the molding compound is injected into the upper and lower mold cavities 414 and 458.

The lower cavity bar 452 is secured to the lower clamping plate 454 by a plurality of threaded fasteners 462. Each threaded fastener 462 is fed through a cylindrical cavity 464 formed in the lower clamping plate 454 and is screwed into a tapped recess 466 formed in the lower cavity bar 452. This configuration does not permit the lower cavity bar 452 to move independently from the lower clamping plate 454.

In operation, a mechanical press (not shown) pushes on the push bar 410 to force the upper mold-tooling portion 402 down against the lower mold-tooling portion 450. As the upper mold halves 412 mate with the lower mold halves 456, the upper teeth (e.g., teeth 204 in FIGS. 2A and 2B) engage the lower spaces (e.g., spaces 218 in FIGS. 2A and 2B), and the lower teeth (e.g., teeth 214 in FIGS. 2A and 2B) engage the upper spaces (e.g., spaces 208 in FIGS. 2A and 2B). If the teeth and spaces are not properly aligned as shown in FIG. 3, then the chamfers (e.g., 206a and 206b) on the upper teeth push against the chamfers (e.g., 216a and 216b) on the lower teeth causing the upper cavity bars 404a-404c to move horizontally (e.g., right, left, fore, and/or aft) until the upper and lower mold halves 412 and 456 are properly aligned. As a result, gaps, such as the gap shown in FIG. 3, are not formed, and the corresponding resin bleeding does not occur.

Although FIG. 4 shows one embodiment in which the cavity bars 404a-404c of only the upper mold-tooling portion 402 are configured to move horizontally, embodiments of the present invention are not so limited. According to alternative embodiments, the lower cavity bar 452 can be configured to move horizontally in addition to, or instead of, the upper cavity bars 404a-404c bars being configured to move horizontally. In such embodiments, the lower mold-tooling portion 450 may be implemented with attachment mechanisms similar to attachment mechanisms 416 and location pins similar to location pins 428.

Further, although FIG. 4 shows three cavity bars 404a, 404b, and 404c that move horizontally, embodiments of the present invention are not so limited. According to alternative embodiments of the present invention, the tooling may have as few as one cavity bar or more than three cavity bars that move horizontally. Further, each cavity bar may have as few as one mold cavity or more than four cavities.

In alternative embodiments of the present invention, mold tooling does not comprise lower mold cavities such as lower mold cavities 458. Such embodiments support the assembly of packaged semiconductor devices in which the bottom surface of the die paddle is not encapsulated in molding compound (in contrast to device 100 of FIG. 1, where the bottom surface of the die paddle 104 is encapsulated).

Although the tooling 400 of FIG. 4 was described relative to its use with a mold that comprises teeth for bending the leads of a lead frame onto two separate planes, embodiments of the present invention are not so limited. According to alternative embodiments of the present invention, the tooling 400 of FIG. 4 can be used with molds (not shown) that comprise teeth for bending the leads of a lead frame onto as few as one plane or more than two separate planes.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

A lead frame is a collection of metal leads and possibly other elements (e.g., die paddles, power bars) that is used in semiconductor packaging for assembling a single packaged semiconductor device. Prior to assembly into a packaged device, a lead frame may have support structures (e.g., a rectangular metal frame) that keep those elements in place. During the assembly process, the support structures may be removed. As used herein, the term "lead frame" may be used to refer to the collection of elements before assembly or after assembly, regardless of the presence or absence of those support structures.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The invention claimed is:

1. Tooling for molding a semiconductor device, the tooling comprising:
   a clamping plate;
   a first cavity bar comprising a first mold half having a mold cavity formed therein for molding the semiconductor device, and wherein the first mold half comprises:
      a plurality of teeth, and
      a space between each pair of adjacent teeth, wherein the teeth and the spaces support bending of leads of a lead frame of the semiconductor device;
   a second cavity bar comprising a second mold half, wherein the second mold half comprises structures to engage the teeth and spaces of the first mold half, wherein the leads are bent when the two mold halves are brought together; and
   an attachment mechanism that secures the first cavity bar to the clamping plate, wherein the attachment mechanism permits the first cavity bar to (i) slide in a first, horizontal direction relative to the clamping plate when the first cavity bar is being secured to the clamping plate to facilitate seating of the second mold half structure to the plurality of teeth, and in a second direction perpendicular to the first direction.

2. The tooling of claim 1, wherein the attachment mechanism comprises:
   a threaded fastener fed through a cavity of the clamping plate into a tapped recess in the first cavity bar;
   a washer positioned between a head of the threaded fastener and a surface of the clamping plate; and
   a spacer positioned in the cavity of the clamping plate, wherein the spacer creates a stand-off between the washer and the clamping plate.

3. The tooling of claim 1, further comprising a location pin that limits the sliding motion of the first cavity bar relative to the clamping plate.

4. The tooling of claim 1, wherein the teeth and spaces of the first mold half are configured to bend leads of a lead frame into (i) a first row of leads on a first plane and (ii) a second row of leads on a second plane, different from the first plane.

5. A packaged semiconductor device assembled using the tooling of claim 1.

* * * * *